(12) United States Patent
Taylor

(10) Patent No.: US 6,624,697 B2
(45) Date of Patent: Sep. 23, 2003

(54) HIGH FREQUENCY DIFFERENTIAL AMPLIFIER

(75) Inventor: Clive Roland Taylor, Welwyn Garden (GB)

(73) Assignee: Jennic Limited, Sheffield (GB)

( * ) Notice: Subject to any disclaimer, the term of this patent is extended or adjusted under 35 U.S.C. 154(b) by 0 days.

(21) Appl. No.: 10/044,007

(22) Filed: Jan. 11, 2002

(65) Prior Publication Data

US 2002/0093381 A1 Jul. 18, 2002

(30) Foreign Application Priority Data

Jan. 12, 2001 (GB) ............................................ 0100884

(51) Int. Cl.[7] ................................................. H03F 3/45
(52) U.S. Cl. ........................ 330/258; 330/253; 330/261
(58) Field of Search ................................ 330/253, 258, 330/261

(56) References Cited

U.S. PATENT DOCUMENTS

| 4,048,575 | A | | 9/1977 | Musa | 330/22 |
| 5,668,468 | A | | 9/1997 | Cargill | 323/316 |
| 6,107,859 | A | * | 8/2000 | Moyal | 326/82 |
| 6,137,362 | A | * | 10/2000 | Dufossez | 330/254 |
| 6,377,122 | B1 | * | 4/2002 | Rokhsaz | 330/253 |
| 6,429,700 | B1 | * | 8/2002 | Yang | 330/258 |

FOREIGN PATENT DOCUMENTS

| WO | WO 95/23472 | 8/1995 |
| WO | WO 00/27029 | 5/2000 |

* cited by examiner

Primary Examiner—Patricia Nguyen
(74) Attorney, Agent, or Firm—Kirkpatrick & Lockhart LLP

(57) ABSTRACT

The present invention relates to a folded differential amplifier having very high output impedance capable of being operated at frequencies of the order of gigahertz.

7 Claims, 3 Drawing Sheets

HIGH FREQUENCY DIFFERENTIAL AMPLIFIER

FIELD OF THE INVENTION

The present invention relates to a high frequency differential amplifier.

1. Background to the Invention

Existing prior art low voltage differential stage receiver input output cells that condition, that is, which square up, low voltage differential high frequency signals, such as, for example, 622 MHz, are presently required to provide some form of hysteresis to prevent inadvertent output switching caused by either (a) a momentary high impedance state of the input signals, that is, floating inputs, or (b) packaging of effects such as ringing and signal overlap. The gain required for signal squaring at 622 MHz is substantial when implemented using a 0.18 micron CMOS process. It will be appreciated that the provision of the required hysteresis requires a corresponding increase in gain margin. Since, under worst-case conditions, the 622 MHz output is only just realisable using conventional circuit techniques, the minimum hysteresis value is at best only present under typical to worst-case conditions, if at all.

It is an object of the present invention at least to mitigate the above problems of the prior art.

2. Summary of the Invention

Accordingly, an embodiment of the present invention provides an amplifier comprising an input stage having at least one signal input terminal and a biasing arrangement arranged to bias the at least one signal input terminal, an output stage comprising a pair of FET transistors arranged such that the gates thereof are biased using a common mode gate bias voltage derived from a resistor divider formed between the output terminals of the pair of FET transistors.

Advantageously, embodiments of the present invention increase, and preferably maximise, the hysteresis above a level of 25 mV under all operating conditions.

It will be appreciated that such a hysteresis requires extra gain to give the required margin.

In an embodiment, if a 40 mV (±20 mV) hysteresis is required, it will be appreciated that the effective minimum differential input signal amplitude value for the circuit without hysteresis changes from the ±100 mV specified level to ±80 mV, ie the circuit gain needs to be appropriately increased. This embodiment achieves a 40 mV hysteresis.

Embodiments of the present invention allow the realisation of a high output impedance differential amplifier that is operable at high clocking speeds or that can process high frequency signals. This is in contrast to conventional output stages that use diode configured FETs that produce relatively low output impedances and which also suffer from the switching limitations imposed by the gates capacitances.

BRIEF DESCRIPTION OF THE DRAWINGS

Embodiments of the present invention will now be described, by way of example only, with reference to the accompanying drawings in which.

DESCRIPTION OF THE PREFERRED EMBODIMENTS

Figure 1:
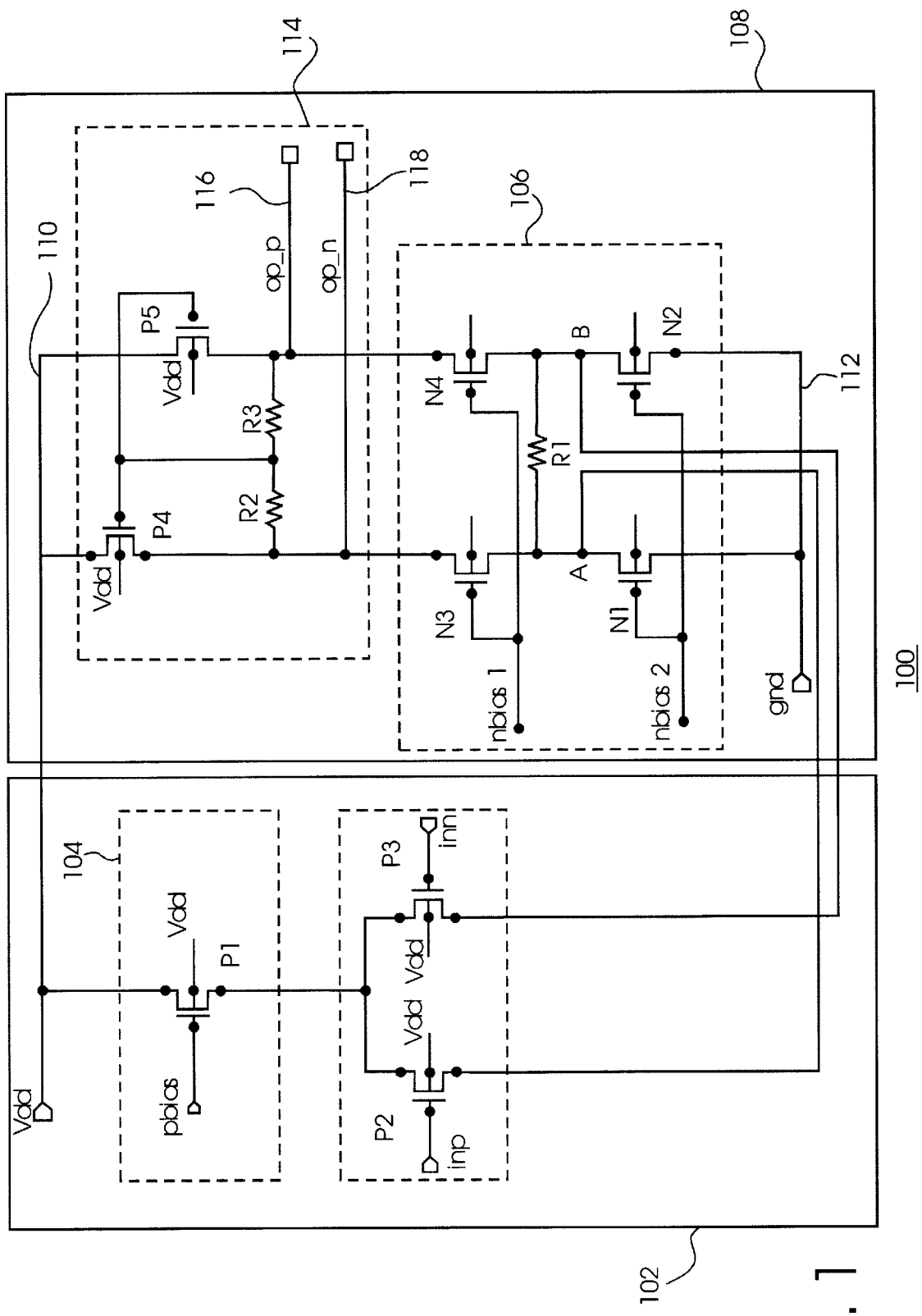
FIG. 1 illustrates an embodiment of a high speed differential amplifier.

FIG. 1 shows a differential amplifier according to a first embodiment. The differential amplifier 100 comprises a differential input stage 102 having two PMOS FETs $P_2$ and $P_3$ as inputs. The differential input stage 100 additionally comprises a current source 104. The current source is implemented using a suitably biased pMOS FET $P_1$. Preferably, the bias voltage applied to the pMOS current source 104 provides a current of 150 µA x3.

It will be appreciated that the pMOS FETs $P_2$ and $P_3$ forming the inputs of the differential input stage 102 are matching pairs. The drains of the PMOS FETs $P_2$ and $P_3$ forming the input stage 102 are coupled to a further current source 106, that is, to a current source of an output stage 108. The further current source 106 comprises four nMOS FETs N1 to N4. The nMOS FETs N1 to N4 are arranged in series, between power lines 110 and 112, with an output driver stage 114. The further current source 106 is arranged such that nMOS FETs N1 and N3 are in series, PMOS FETs N2 and N4 are in series and nMOS FETs N1 and N3 are in parallel with nMOS FETs N2 and N4. A resistor R1 is coupled between two nodes A and B formed by the series arrangements of nMOS FETs N1 and N3 and nMOS FETs N2 and N4.

The output driver stage 114 comprises fourth and fifth pMOS FETS $P_4$ and $P_5$. The gates of the pMOS FETS P4 and P5 are coupled to the mid-point of a resistive arrangement, that is, a resister divider formed by two resistors $R_2$ and $R_3$ of equal value, R. The outputs 116 and 118 of the output driver stage 114 are taken from the drains of the first and second PMOS FETS P4 and P5. In a preferred embodiment, it should also be noted that the first and second pMOS FETs P4 and P5 of the output driver stage 114 are matched.

Although the first embodiment utilises values of $R_2$ and $R_3$ that are equal, asymmetrical values of $R_2$ and $R_3$ could be used to compensate for asymmetry in the succeeding stages.

Figure 2:
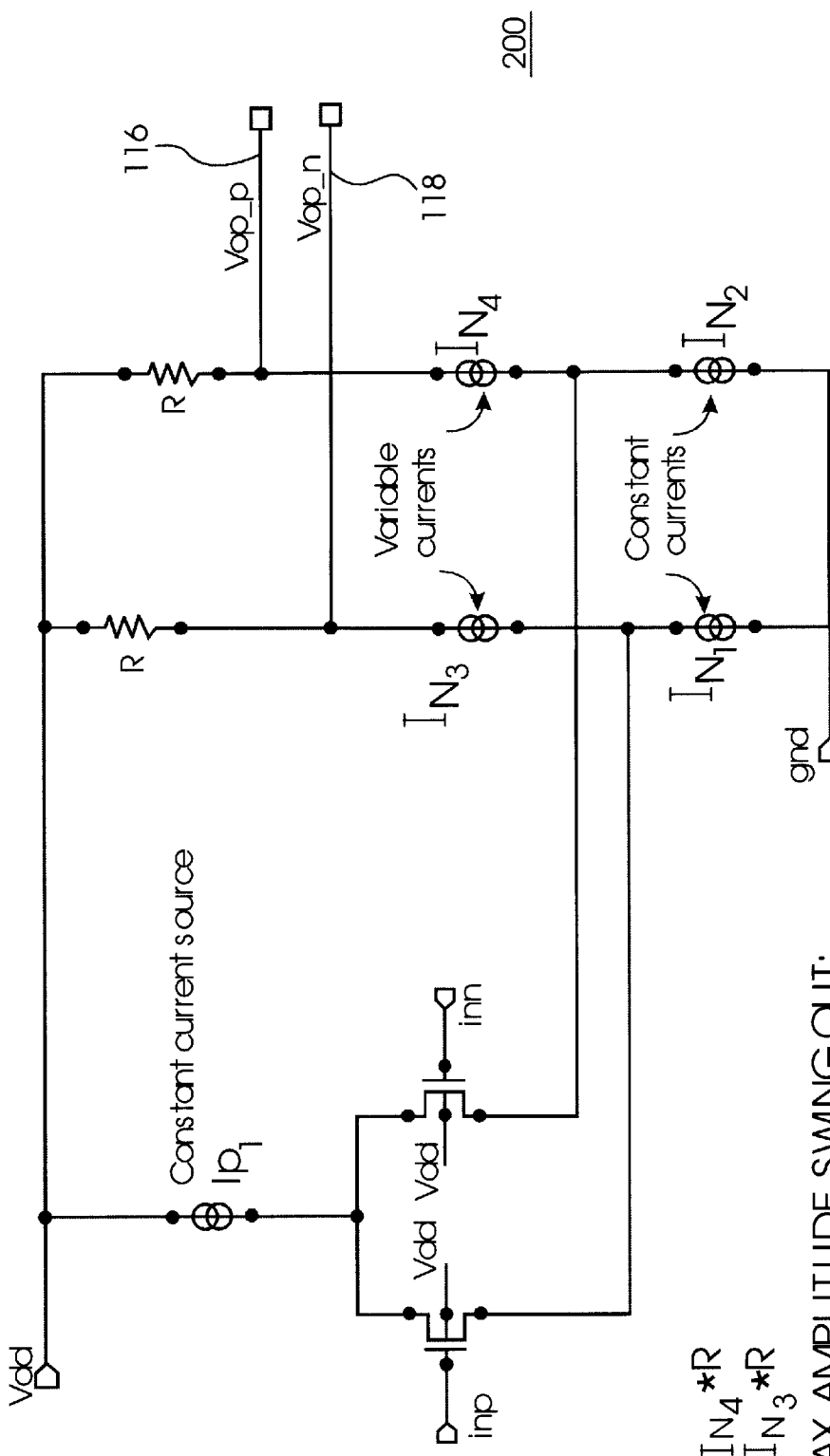
FIGS. 2 and 3 show schematically the operation of the embodiment shown in FIG. 1.

The operation of the circuit will now be described with reference to FIG. 2, which shows a schematic version of the first embodiment. Referring to the circuit 200 of FIG. 2, it can be appreciated that the current sources formed by pMOS FET P1 and nMOS FETs N1 to N4 have been replaced by schematic current sources producing respective currents. The first current source, formed by PMOS FET P1, produces a constant current $I_{P_1}$. The output stage 108 current sources, that is, nMOS FETs N1 and N2, also produce constant currents $I_{N_1}$ and $I_{N_2}$. However, the current sources realised by nMOS FETs N3 and N4 are arranged to produce variable currents $I_{N_3}$ and $I_{N_4}$. The "variable" current sources follow as a consequence of the current through $P_2$ and $P_3$ from current source $I_{P_1}$ acting on nodes A and B and thus altering the VGS values of $N_3$ and $N_4$, ie, the currents entering these nodes must equal the currents leaving them (Kirchoff's current law). This arrangement is known as a folded differential amplifier stage.

The output voltages $V_{op-p}$ and $V_{op-n}$ that appear at output terminals 116 and 118 are given by the following equations:

$$V_{op-p} = I_{N_4} * R$$

$$V_{op-n} = I_{N3} * R$$

The maximum amplitude swing, $V_{out}$, between the output terminals 116 and 118 is given by the following:

$$V_{OUT} = (I_{N_1} * R) - ([I_{N_1} - I_{P_1}] * R)$$

which gives $$V_{OUT-IP_1}*R$$

since $I_{N_1} = I_{N_2}$.

The common mode bias voltage for the gates of the output PMOS devices P4 and P5 is derived from the resistor divider formed across the differential outputs 116 and 118. This ensures that the gates receive the correct bias voltage levels according to output currents generated and associated noise components, that is, switching or substrate noise.

It will be appreciated that an advantage of this circuit is that the output loads have a high impedance with negligible (diffusion) capacitance for the same current drive as a conventional pair of diode configured PMOS output drivers which maximise voltage gain.

Figure 3:
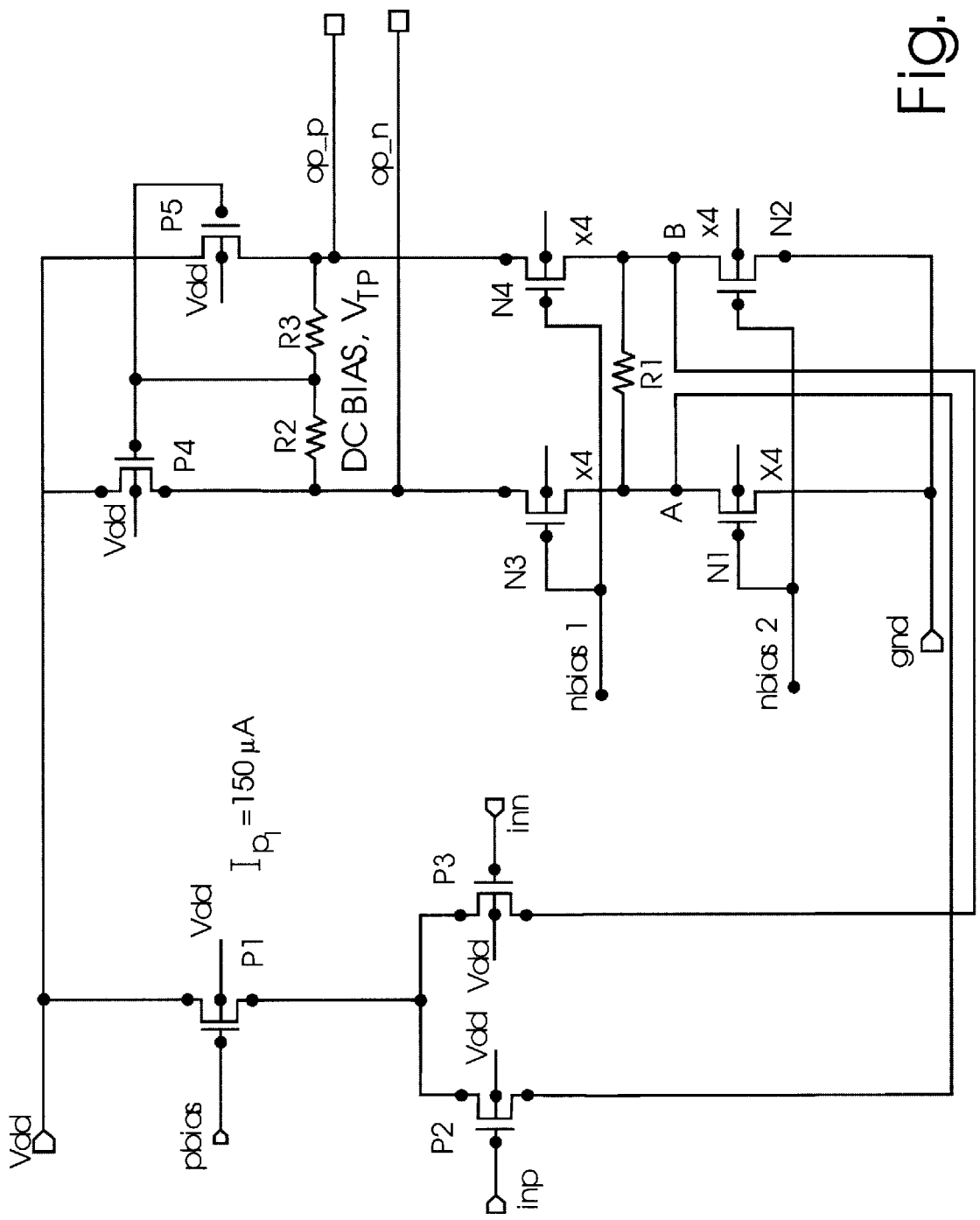

Further aspects of the operation of the first embodiment are shown in FIG. 3. Assuming that the first current source $P_1$ produces a current of 150 μA x3, which will represent the normalised current, that is, x1 represents 150 μA, x4 represents 600 μA. Assume also that the current sources $N_1$ to $N_4$ produce respective x4 currents, the DC bias voltage of the output voltage, $V_{out}$, will be given by $$V_{TP} = [(x4 - (x1.5)]/g_m = (x2.5)/g_m$$

and the maximum amplitude swing of $V_{out}$ is given by $R*(x3)$, assuming $R \ll g_{ds}$ of $P_4$ and $P_5$,
where $g_m$ is the transconductance and $g_{ds}$ is the channel length modulation effect.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

I claim:

1. An amplifier comprising an input stage (102) having at least one signal input terminal and a biasing arrangement ($P_1$) arranged to bias the at least one signal input terminal, an output stage (108) comprising a pair of FET transistors ($P_4$; $P_5$) arranged such that the gates thereof are biased using a common mode gate bias voltage (VB) derived from a resistive arrangement ($R_2$; $R_3$) formed between the output terminals (116, 118) of the pair of FET transistors ($P_4$; $P_5$)

2. An amplifier as claimed in claim 1, in which the input stage comprises two signal input terminals (104; 106) and is operable in a common differential mode.

3. An amplifier as claimed in claim 2; in which the input stage comprises two matched FETs ($P_2$, $P_3$) arranged in parallel with each other and in series with the biasing arrangement.

4. An amplifier as claimed in claim 3, in which an input voltage swing limit for at least one input signal applied to the at least one signal input terminal is determined by a characteristic of at least one of the two FETs ($P_2$, $P_3$).

5. An amplifier as claimed in claim 4, in which the at least one characteristics includes at least one of the FET's fall-time value and the required frequency of operation of said at least one input signal applied to said at least one signal input terminal.

6. An amplifier as claimed in claim 1, in which the biasing arrangement is a constant current source ($P_1$).

7. An amplifier as claimed in claim 7, in which the current biasing stage (106) comprises at least a matched pair of parallel arranged first ($N_1$) and second ($N_2$) constant current sources in series with at least a pair of parallel arranged first ($N_3$) and second ($N_4$) variable current sources, with the clamping resistor ($R_1$) being coupled between the drains of the first ($N_1$) and second ($N_2$) constant current sources and the sources of first ($N_3$) and second ($N_4$) variable current sources.

* * * * *